United States Patent [19]

Fujimoto

[11] Patent Number: 6,056,998
[45] Date of Patent: May 2, 2000

[54] COATING APPARATUS AND COATING METHOD

[75] Inventor: Akihiro Fujimoto, Kumamoto-ken, Japan

[73] Assignee: Tokyo Electron Limited, Tokyo, Japan

[21] Appl. No.: 09/032,834

[22] Filed: Mar. 2, 1998

[30] Foreign Application Priority Data

Mar. 3, 1997 [JP] Japan ..................................... 9-047723

[51] Int. Cl.$^7$ ..................................................... B05C 5/00
[52] U.S. Cl. .......................... 427/240; 427/425; 118/683; 118/684; 118/610; 118/52; 118/56; 118/319; 118/320
[58] Field of Search .................................... 118/683, 684, 118/610, 52, 56, 319, 320; 427/240, 425

[56] References Cited

U.S. PATENT DOCUMENTS

| | | | |
|---|---|---|---|
| 5,658,615 | 8/1997 | Hasebe et al. | 427/240 |
| 5,664,254 | 9/1997 | Ohkura et al. | 396/612 |
| 5,766,359 | 6/1998 | Sichmann et al. | 118/610 |
| 5,858,466 | 1/1999 | Liu et al. | 118/610 |

FOREIGN PATENT DOCUMENTS

| | | |
|---|---|---|
| 8-222618 | 8/1996 | Japan . |
| 96/3273 | 10/1996 | WIPO . |

*Primary Examiner*—Laura Edwards
*Attorney, Agent, or Firm*—Oblon, Spivak, McClelland, Maier & Neustadt, P.C.

[57] ABSTRACT

A coating apparatus of the present invention comprises coating solution supply sources for supplying a coating solution, a mounting table for holding a substrate to allow a surface to be coated to face upward, nozzles for pouring the coating solution toward the surface of the substrate to be coated, mounted on the mounting table, a pump chamber capable of swinging its volume and having a sucking port for introducing the coating solution from the coating solution supply source and a spurting port for spurting the coating solution and to be supplied toward the nozzle, pump driving mechanisms for increasing and decreasing an inner pressure of the pump chamber to introduce and spurt the coating solution into/from the pump chamber, a filter provided inside or at the upstream side of the pump chamber for filtrating the coating solution before the coating solution is spurted out from the pump chamber through the spurting outlet, a valve provided between the pump chamber and the nozzle for regulating a flow amount of the coating solution to be sent from the pump chamber to the nozzle, and a controller for controlling the operation of the pump driving mechanism in such a manner that a sucking speed of the coating solution into the pump chamber is smaller than a spurting speed of the coating solution from the pump chamber.

24 Claims, 12 Drawing Sheets

VOLUME OF LIQUID
INTRODUCED INTO
A PUMP CHAMBER

F I G. 13A

VOLUME OF LIQUID
DISCHARGED FROM
A PUMP CHAMBER

F I G. 13B

OPENING DEGREE OF VALVE

F I G. 13C

F I G. 14

F I G. 15

COATING APPARATUS AND COATING METHOD

BACKGROUND OF THE INVENTION

The present invention relates to a coating apparatus for coating a liquid agent such as a resist solution and an anti-reflection film coating (ARC) solution on a substrate such as semiconductor wafer and an LCD substrate.

In a manufacturing process for a semiconductor device, usually a photographic technology is used. In the photolithographic technology, a resist is first coated over a surface of the semiconductor wafer, exposed to light to form a predetermined pattern, and subjected to a developing step. In this manner, the resist film having a predetermined pattern is formed on the wafer. The resultant substrate is further subjected to a film formation step and an etching step to form a circuit having a predetermined pattern. The series of resist processing treatments are usually performed in a coating/developing system disclosed in U.S. Pat. No. 5,664,254.

At present, mostly used as the method for coating the resist solution over a wafer is a spin-coating method. In the spin coating method, a resist solution is pumped up from a tank, filtrated by a filter, and spurted out from a nozzle toward the wafer W by way of an operate valve. Since the wafer W is spin-rotated while being held by a spin chuck, the resist solution is spread swiftly over the entire wafer surface by centrifugal force, thereby forming a resist film having a uniform thickness.

However, there is a problem with the conventionally used coating apparatus; when the resist solution is spurted out from the pump toward the filter, particles and a gelatinized resist solution which have been captured by the filter are removed from the filter by spurting pressure. These removed materials sometimes attach to the wafer. In particular, when a large amount of the resist solution is spurted out in one time, impact of the spurting current upon the filter becomes large. It follows that the captured materials are likely to remove from the filter to generate defects in the coating film of the substrate. The occurrence rate of the defects of the coated film increases with an increase in size of the substrate, decreasing the yield of the device.

Recently, a wafer size tends to increase and a device circuit has been miniaturized. With this tendency, a low-viscosity resist solution and low-viscosity anti-reflection coating film solution (hereinafter referred to as "ARC solution") containing a surfactant have been increasingly used. However, there are problems when the low-viscosity coating solution is used; bubbles are likely to generate in the coating solution passed through a filter when it spurts out. If the coating solution containing bubbles is supplied to the wafer, defects may be generated in the formed coating film.

BRIEF SUMMARY OF THE INVENTION

An object of the present invention is to provide a coating apparatus and a coating method of a liquid material on a substrate characterized in that captured materials such as particles are not removed from a filter when a coating solution is spurted out.

Another object of the present invention is to provide a coating apparatus and a coating method of a liquid material on a substrate characterized in that a coating solution is spurted out toward a substrate without containing bubbles.

Figure 14:
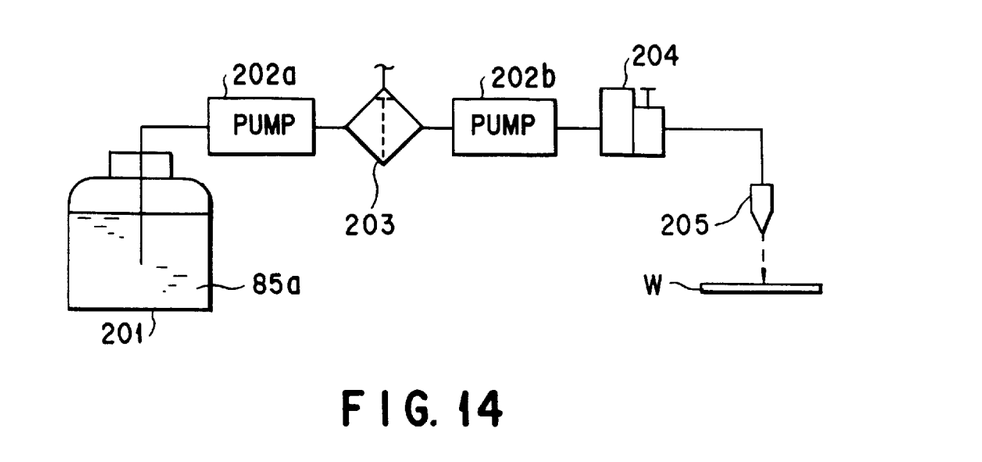
FIG. 14 is a schematic block diagram showing a coating apparatus according to a comparative embodiment.
Figure 15:
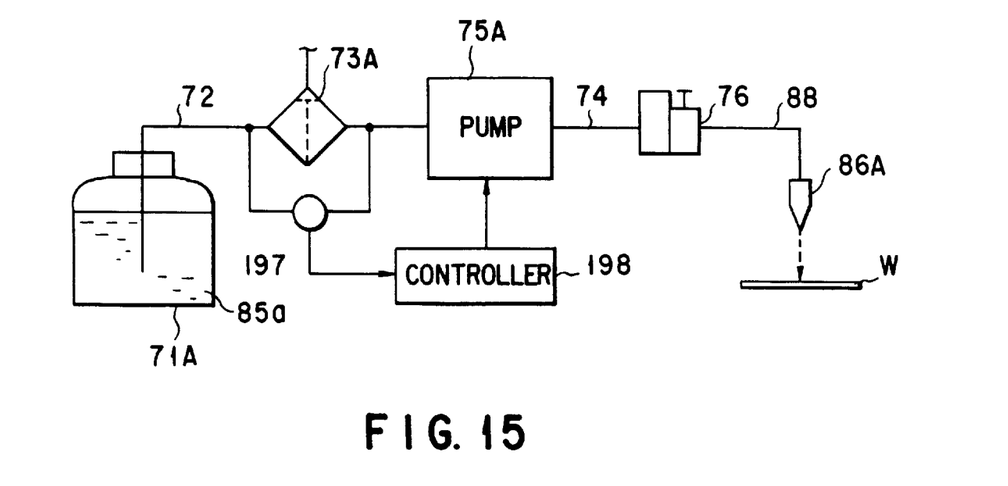
FIG. 15 is a schematic block diagram showing a coating apparatus (a coating apparatus equipped with a pump having an independent filter set upstream thereof) according to another embodiment.

The present inventors formed films on silicon wafers by applying a coating solution 85a containing a surfactant by use of the apparatus shown in FIG. 14 (Comparative Example) and by use of an apparatus shown in FIG. 15 (Example). Comparison was made between the films of Comparative Example and those of Example. The coating solution supply route of the apparatus (Comparative Example) has a tank 201, an upstream pump 202a, a filter 203, a downstream pump 202b, an operate valve 204, and a nozzle 205 which are arranged in the order mentioned from the upstream. The coating solution supply route of the apparatus (Example) has a tank 71A, a filter 73A, a downstream pump 75A, an operate valve 74, and a nozzle 86A, which are arranged in the order mentioned from the upstream. The apparatus (Example) is further equipped with a pressure-difference detector 197 and a controller 198. The pressure-difference detector 197 detects difference in pressure between a primary side (upstream side) and a secondary side (downstream side) of the filter 73A. The controller controls the downstream pump 75A on the basis of the pressure-difference detection signal detected from the pressure-difference detector 197.

In the apparatus (Comparative Example), the coating solution is pumped up from the tank 201 by the upstream pump 202a and sent to the filter 203, while the coating solution is being pumped up through the filter 203 by the downstream pump 202b and sent to the nozzle 205. In this mechanism, a filtration rate of the solution 85a through the filter 203 is not dependent upon the spurting speed of the solution 85a from the nozzle 205. The difference in pressure (pressure loss) between the primary side and the secondary side of the filter 203 can be reduced drastically. However, since the apparatus of Comparative Example has two pumps 202a and 202b, the apparatus increases in size.

On the other side, in the apparatus of Example, the pressure difference between the primary side and the secondary side of the filter 203 can be suppressed by the controller 198 in combination with the pressure-difference detector 197. It is therefore possible for the captured materials such as particles to stay in the filter at the time the solution is spurted out. Furthermore, since only one pump 75A is employed, the apparatus can be reduced in size.

The coating apparatus according to the present invention comprises:

a coating solution supply source for supplying a coating solution;

a mounting table for holding a substrate to allow a surface to be coated to face upward;

a nozzle for pouring the coating solution toward the surface of the substrate to be coated, mounted on the mounting table;

a pump chamber capable of swinging its volume and having a sucking port for introducing the coating solution from the coating solution supply source and a spurting port for spurting the coating solution to be supplies toward the nozzle;

a pump driving mechanism for increasing or decreasing an inner pressure of the pump chamber to introduce and spurt the coating solution into/from the pump chamber;

a filter provided inside or at the upstream side of the pump chamber for filtrating the coating solution before the coating solution is spurted out from the pump chamber through the spurting outlet;

a valve provided between the pump chamber and the nozzle for regulating a flow amount of the coating solution to be sent from the pump chamber to the nozzle; and a controller for controlling the operation of the pump driving mechanism in such a manner that a sucking speed of the coating solution into the pump chamber is smaller than a spurting speed of the coating solution from the pump chamber.

The coating method according to the present invention comprises the steps of:

(a) preparing a mounting table, a coating solution supply source, a filter, a pump chamber, a pump driving mechanism, a nozzle and an operation valve;

(b) mounting a substrate on the mounting table;

(c) filtrating a coating solution by sending the coating solution to the filter from the coating solution supply source;

(d) sucking the filtrated coating solution into the pump chamber by the pump driving mechanism at a first flow rate;

(e) discharging the coating solution from the pump chamber by the pump driving mechanism at a second flow rate which is faster than the first flow rate; at the same time opening the operation valve; and (f) forming a coating film by discharging the coating solution from the nozzle toward the substrate mounted on the mounting table.

In the present invention, since the coating solution is filtrated by a filter before the solution is introduced into the pump chamber, the flow rate of the coating solution through the filter is dependent upon the sucking speed of the coating solution into the pump chamber and independent upon the spurting speed of the coating solution from the pump chamber. If the sucking speed of the coating solution is set smaller than the spurting speed, the flow rate of the coating solution can be rendered slow, reducing the impact of the coating solution upon the filter to a negligibly low level. Hence the foreign materials captured by the filter are not removed from the filter. It is therefore possible to form a coating film having a good quality on the substrate.

Figure 13A:
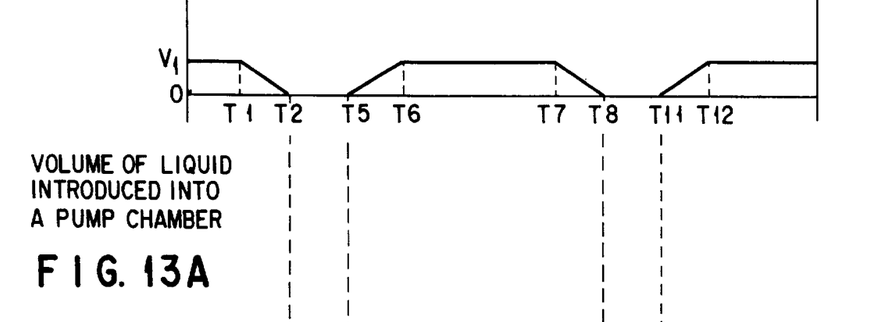
FIGS. 13A to 13C are timing charts indicating the sucking and spurting amounts of the liquid by a pump and open degree of a valve.

To form the coating film in a desired thickness, the spurting speed of the coating solution has to be defined at a constant value. However, the sucking speed of the coating solution can be freely set during the period from the spurting-termination time T5 to the next spurting-initiation time T8, as shown in FIG. 13A. Hence the sucking speed of the coating solution can be set extremely smaller than the spurting speed. As a result, the pressure difference (pressure loss) between the primary side and the secondary side of the filter, can be reduced, preventing the foreign materials captured by the filter from being removed. It is therefore possible to form a coating film having a good quality.

Furthermore, in the present invention, since bubbles are discharged from the pump chamber via a vent, the spurting solution does not contain bubbles. It is therefore possible to form a coating film having a uniform thickness on the substrate without defects.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, preferred embodiments of the present invention will be explained with reference to the accompanying drawings.

Figure 1:
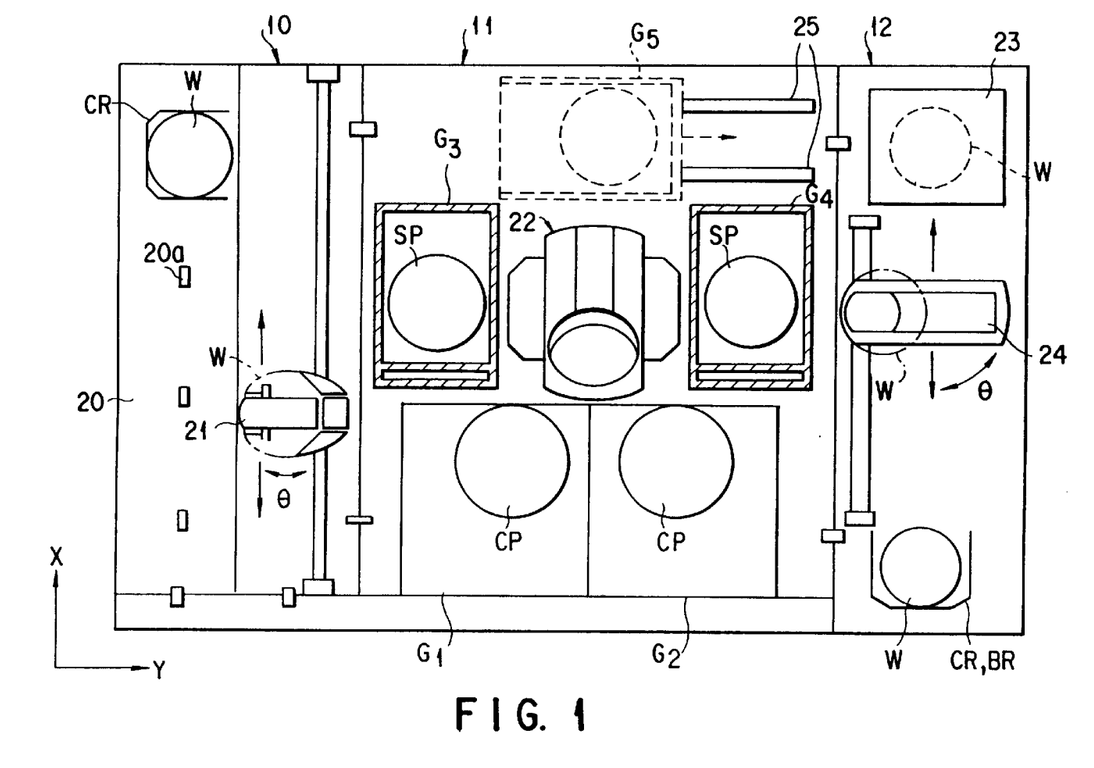
FIG. 1 is a schematic plan view of an entire coating/developing process system for a semiconductor wafer.
Figure 2:
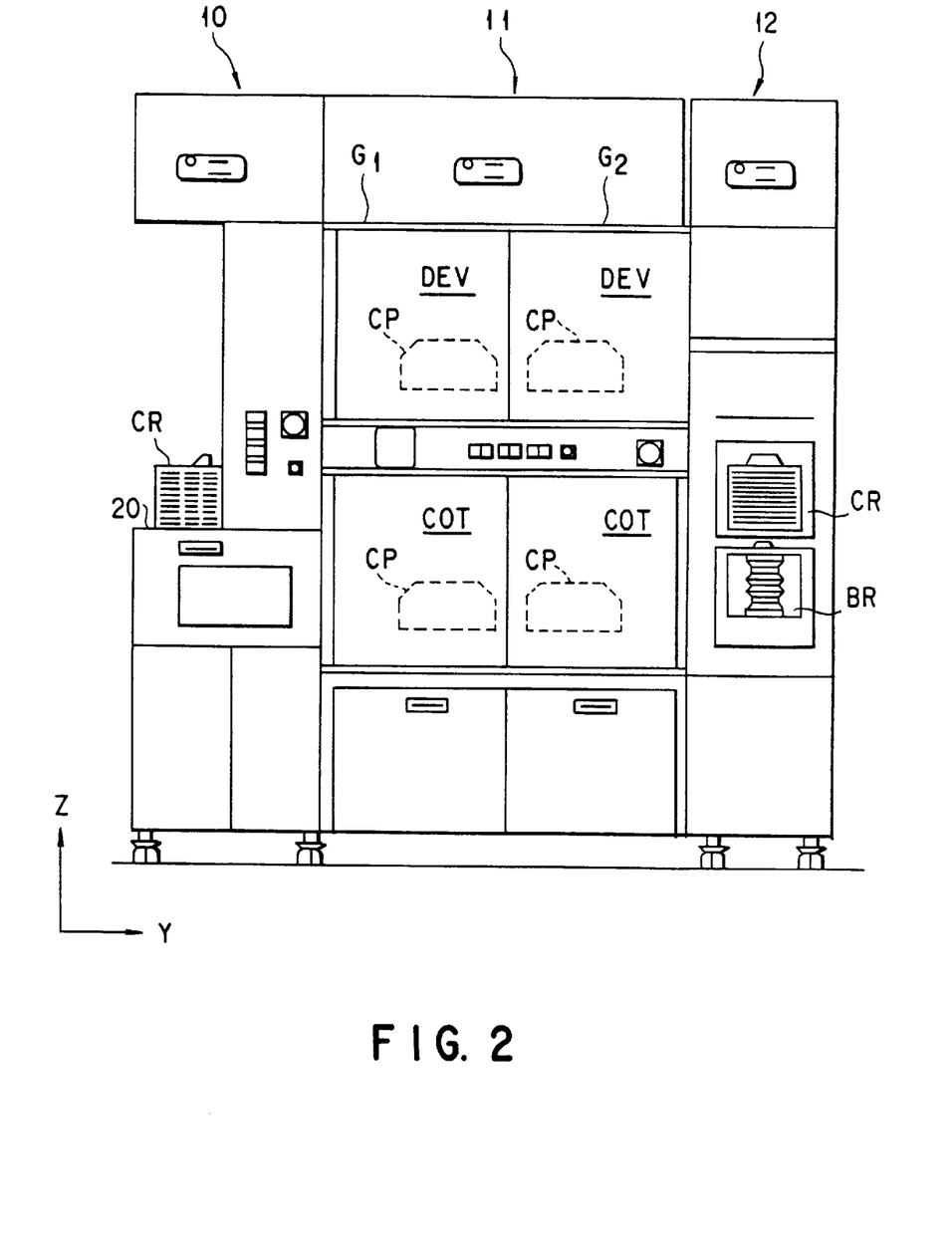
FIG. 2 is a front view of the entire coating/developing process system.
Figure 3:
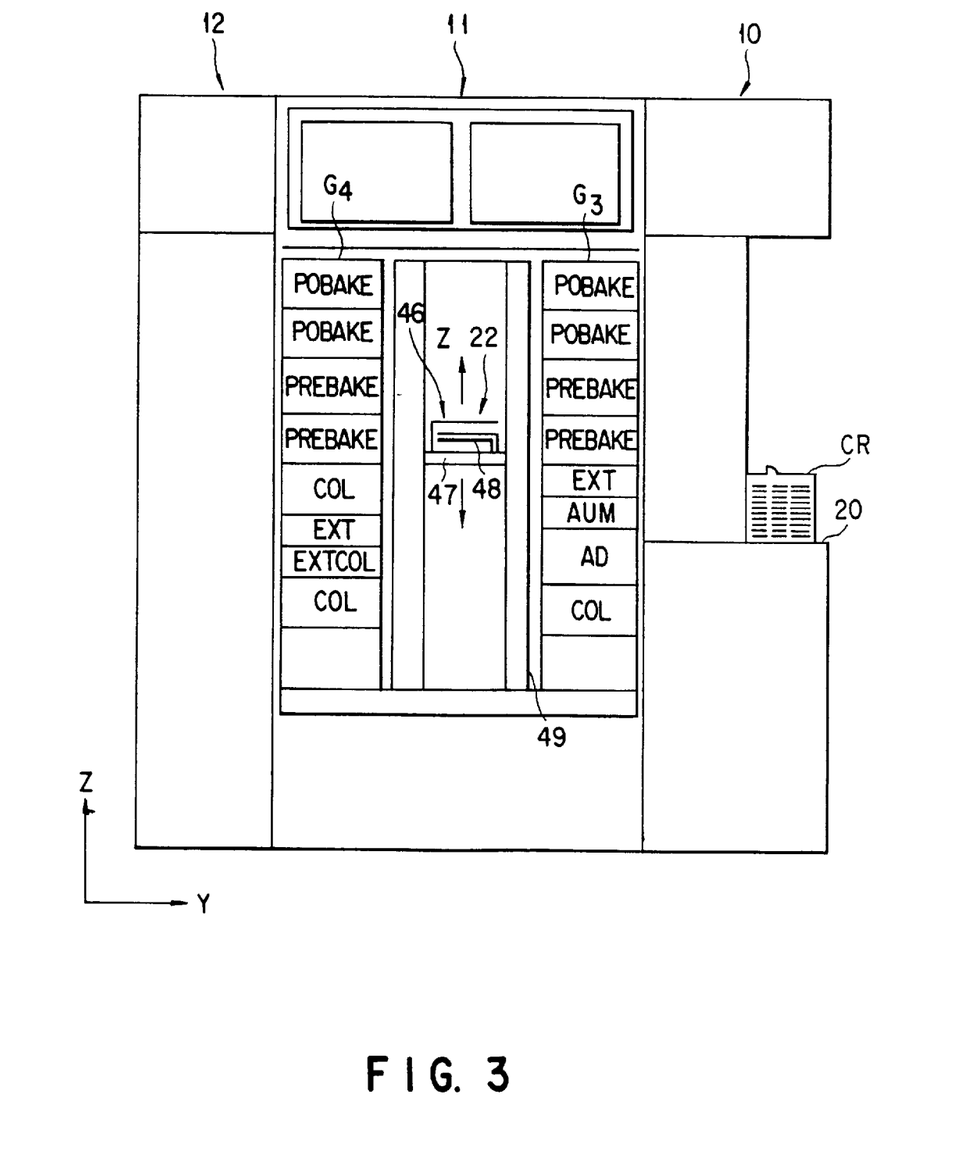
FIG. 3 is a back view of the entire coating/developing process system.

As shown in FIGS. 1 to 3, a coating/developing process system 1 consists of a cassette station 10, a process station 11, and an interface section 12. The cassette station 10 has a mounting table 20 for loading/unloading a cassette CR which houses semiconductor wafers W (eg. 25 wafers). The process station 11 has various single-wafer processing units for treating wafers W one by one. The interface section 12 is provided between the process station 11 and a light-exposure apparatus (not shown).

There are four projections 20a on the mounting table 20. Four cassettes CR are aligned on the process station 11 by means of the projections 20a. Each of the cassettes CR is mounted on the mounting table 20 in such a way that an opening for wafer loading/unloading faces the process station 11.

The cassette station 10 has a first sub-arm mechanism 21 for loading/unloading a wafer W into/from each cassette CR. The first sub-arm mechanism 21 has a holder portion for holding the wafer W, a back-and-forth driving mechanism (not shown) for moving the holder portion back and forth, an X-axis driving mechanism (not shown) for moving the holder portion in an X-axis direction, a Z-axis moving mechanism (not shown) for moving the holder portion in a Z-axis direction, and a θ-rotation mechanism (not shown) for rotating the holder portion about the Z-axis. It should be noted that the first sub-arm mechanism 21 gains access to an alignment unit (ALIM) and an extension unit (EXT) belonging to a third process unit group G3.

As shown in FIG. 3, a main arm mechanism 22 is liftably provided at the center of the process station 11. Five process unit groups $G_1$ to $G_5$ are arranged around the main arm mechanism 22. The main arm mechanism 22 is provided inside the cylindrical supporting body 49 and has a liftable wafer transfer apparatus 46. The cylindrical supporting body 49 is connected to a driving shaft of a motor (not shown). The cylindrical supporting body 49 including the driving shaft is moved together with the wafer transfer apparatus 46 about the Z-axis by an angle θ. The transfer apparatus 46 has a plurality of holder portions 48 movable in the back and forth direction of a transfer table 47.

The units belonging to first and second process unit groups $G_1$ and $G_2$ are arranged in the front of the system 1. The units belonging to a third process unit group $G_3$ are abutted against the cassette station 10. Units belonging to a fourth process unit group $G_4$ are abutted against the interface section 12. Units belonging to a fifth process unit group $G_5$ are arranged on the rear side of the system 1.

As shown in FIG. 2, the first process unit group $G_1$ has two spinner type process units for applying a predetermined treatment to the wafer W mounted on a spin chuck in a cup CP. In the first process unit group $G_1$, for example, a resist coating unit (COT) and a developing unit (DEV) are successively stacked in two stages from the bottom. In the second process unit group $G_2$, two spinner type process units, for example, a resist coating unit (COT) and a developing unit (DEV), are successively stacked in two stages from the bottom. It is preferable that the resist coating unit (COT) be positioned in the lower stage than the developing unit (DEV). This is because it is more difficult to discharge a resist liquid waste than a developing liquid waste. It is therefore desirable that the discharge line of the resist waste be short. However, if necessary, the resist coating unit (COT) may be arranged in the upper stage than the developing unit (DEV).

As shown in FIG. 3, the third process unit group $G_3$ comprises a cooling unit (COL), an adhesion unit (AD), an alignment unit (ALIM), an extension unit (EXT), a prebaking unit (PREBAKE), and a postbaking unit (POBAKE), which are stacked successively from the bottom.

Similarly, the fourth process unit group $G_4$ comprises a cooling unit (COL), an extension cooling unit (EXTCOOL), an extension unit (EXT), a cooling unit (COL), a prebaking unit (PREBAKE), and a postbaking unit (POSTBAKE) which are stacked successively from the bottom.

Since the processing units in which treatments are performed at low temperatures, such as the cooling unit (COL) and the extension unit (EXTCOL), are arranged in lower stages and the processing units in which treatments are performed at high temperatures, such as the baking unit (PREBAKE), the postbaking unit (POBAKE) and the adhesion unit (AD), are arranged in the upper stages, thereby reducing thermal interference between units.

A movable pick-up cassette CR and a fixed-type buffer cassette BR are arranged in two stages in the front portion of the interface section 12. A peripheral light-exposure apparatus 23 is arranged in the back of the interface section 12. A second sub-arm mechanism 24 is provided in the center of the interface section 12. The second sub-arm mechanism 24 is movable in each direction of the X-axis and the Z-axis and capable gaining access to both cassettes CR and BR as well as the peripheral light-exposure apparatus 23. The second sub-arm mechanism 24 is rotatable about the Z-axis by an angle θ and capable of gaining access to the extension unit (EXT) belonging to the fourth process unit group $G_4$ and to a wafer deliver table (not shown) near a light-exposure apparatus (not shown).

In the system 1, the fifth process unit group $G_5$ may be arranged in the back of the main arm mechanism 22. The fifth process unit group $G_5$ can be shifted by sliding along a guide rail 25 in the Y-axis direction. Since the fifth process unit group $G_5$ can be shifted in this way, maintenance work can be made easily since access can be gained to the main arm mechanism 22 from the back side.

Figure 4:
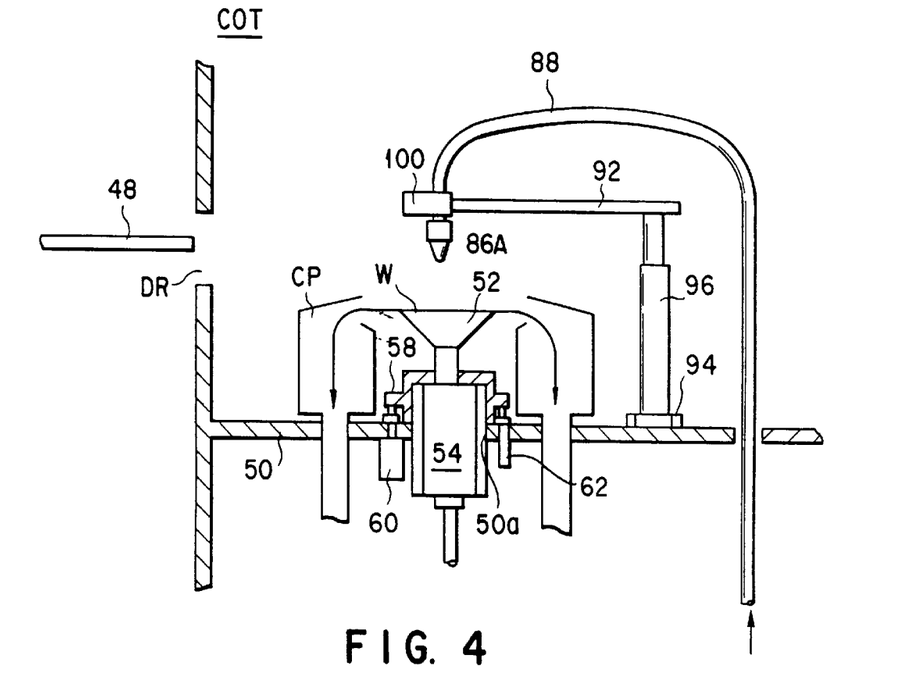
FIG. 4 is a perspective front view of an entire coating unit.
Figure 5:
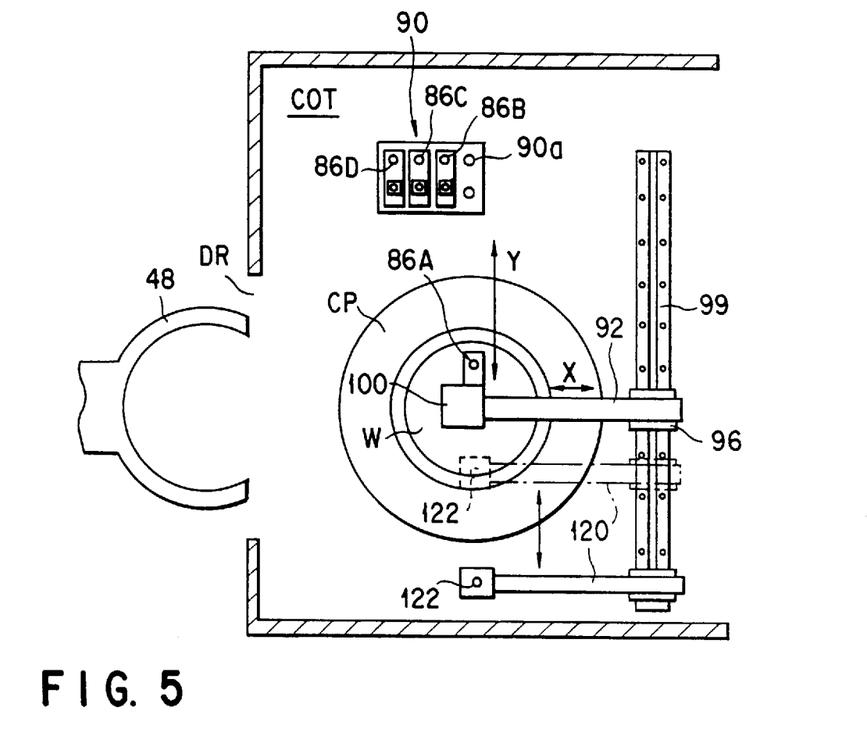
FIG. 5 is a perspective plan view of the entire coating unit.

Next, the coating unit (COT) will be explained with reference to FIGS. 4 and 5.

A circular cup CP is placed at the center of the coating unit (COT). A spin chuck 52 is provided within the cup CP for holding the wafer W by vacuum suction. The spin chuck 52 is rotated by a motor 54. The motor 54 is liftably set at an opening 50a provided in a unit bottom plate 50. For example, the motor 54 is connected to liftable driving means 60 (formed of an air cylinder) and liftable guiding means 62 (formed of air cylinder) via a cap-form flange member 58 formed of aluminium.

Four nozzles 86A to 86D are provided at the coating apparatus and selectively employed depending upon types and viscosity values of the coating solution to be used. More specifically, the first, second, and third nozzles 86A, 86B and 86C are used in forming the resist film. The fourth nozzles 86D is used for forming the ARC film. Each outlet of the nozzles 86A to 86D is inserted into an opening 90a of a nozzle home position 90 and placed in a solvent atmosphere. With this arrangement, a concentration of the solution near each outlet of the nozzles 86A to 86D is controlled constant.

The nozzles 86A to 86C for the resist solution and the nozzle 86D for the ARC solution are detachably connected to a tip portion of a scan arm 92 via a holder 100. The scan arm 92 runs on the guide rail 94 provided on the unit bottom plate 50 and along the Y-axis. Since the scan arm 92 selectively picks up the nozzle 86A to 86D from the nozzle home position 90, it can be moved by the X-axis driving mechanism (not shown) in the X-axis direction.

Furthermore, not only a vertical supporting member 86 for supporting the scan arm 92 but also a vertical supporting member 122 for supporting the scan arm 120 are provided on the guide rail 94 (The vertical supporting member 122 is movable in the Y-axis direction). A rinse nozzle 124 for side rinsing is provided on a tip portion of the scan arm 120. The scan arm 120 and the rinse nozzle 124 move in parallel or in line by the Y-axis driving mechanism (not shown) between a rinse nozzle home position (indicated by a solid line) and a rinse solution spurting position (indicated by a broken line). The rinse nozzle home position is set at the side of the cup CP. The rinse solution spurting position is set above the peripheral portion of the wafer W held by the spin chuck 52. Each of the nozzles 86A to 86D is connected to a process solution supply apparatus set inside a lower chamber of the coating unit (COT) by way of a pipe 88.

Figure 6:
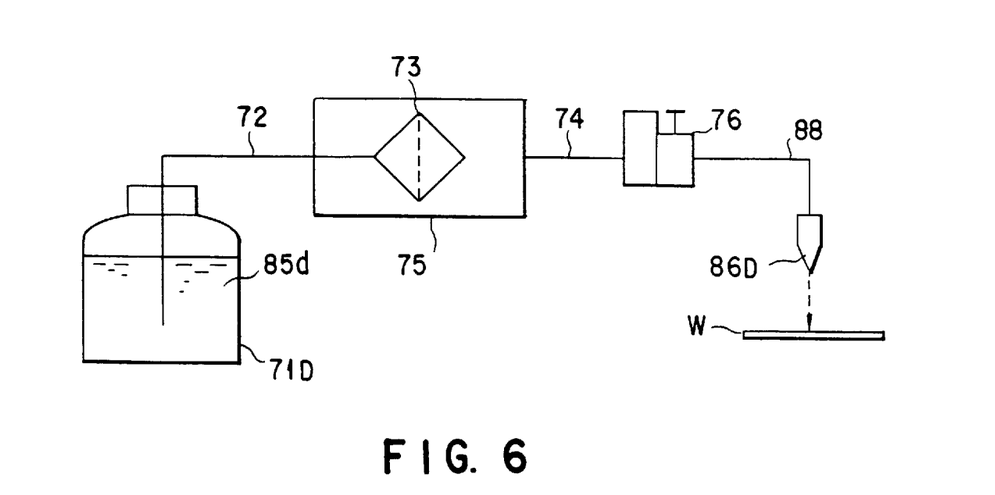
FIG. 6 is a schematic block diagram of a coating apparatus according to an embodiment of the present invention (coating apparatus equipped with a pump having a built-in filter)

As shown in FIG. 6, the ARC solution coating apparatus has a tank 71D, a filter 73, a pump 75, a valve 76, a nozzle 86D, and communication passageways 72, 74, and 88. The tank 71D contains an ARC solution 85d containing a surfactant. The ARC solution 85d stored in the tank 71D is controlled to have a predetermined concentration and temperature (e.g. room temperature). The pump 75 has a pump chamber 63 as shown in FIGS. 7 to 10. A sucking passageway 72 is connected to a lower portion of the pump chamber 63. A spurting passageway 72 is connected to an upper portion of the pump chamber 63. The filter 73 is housed completely in the pump chamber 63 and serves as a part of the pump 75. The filter 73 has a porous pipe 73d at the center. The porous pipe 73d is communicated with the sucking passageway 72. An operate valve 76 is provided on the spurting passageway 74 and controls a flow amount of the coating solution sent from the pump 63 in an on/off regulation manner. The downstream end of the operate valve 76 is connected to the nozzle 86D by way of the passage 88.

As shown in FIG. 15, the resist coating apparatus has a tank 71A, a filter 73A, a pump 75A, a valve 76, the nozzle 86A, and communication passageways 72, 74, and 88. The tank 71A stores a resist solution 85a containing a solvent (e.g., thinner). The resist solution 85a stored in the tank 71A is controlled at a predetermined concentration and temperature (e.g., room temperature). Furthermore, the resist coating apparatus has a pressure-difference detection apparatus 197 and a controller 198. The pressure-difference detection apparatus 197 is used for detecting difference in pressure between a primary side (upstream) and a secondary side (downstream) of the filter 73A. The controller 198 controls the pump 75A positioned downstream of the filter 73A on the basis of the pressure-difference detecting signal sent from the pressure difference detection apparatus 197. The controller 198 works in concert with the pressure-difference detection apparatus 197 to reduce the difference in pressure between the primary side and the secondary side of the filter 73A. Furthermore, an operate valve 76 is provided on the spurting passageway 74 downstream of the pump 75A and controls the flow amount of the resist solution 85a sent from the pump 75A in an on/off manner. The downstream end of the operate valve 76 is connected to the resist nozzle 86A by way of the passage 88.

In the resist coating apparatus, the filter 73A and the pump 75A are discretely provided. To explain more specifically, the filter 73A is provided upstream of the pump 75A. Therefore, the resist solution 85a flows into the pump 75A through the filter 73A from the tank 71A. It should be noted that a bellows type pump (a bellows is directly connected to a pump chamber other than a tubephragm type pump) may be used as the pump 75A.

Next, a pump equipped with a build-in filter will be explained with reference to FIGS. 7 to 10.

Figure 7:
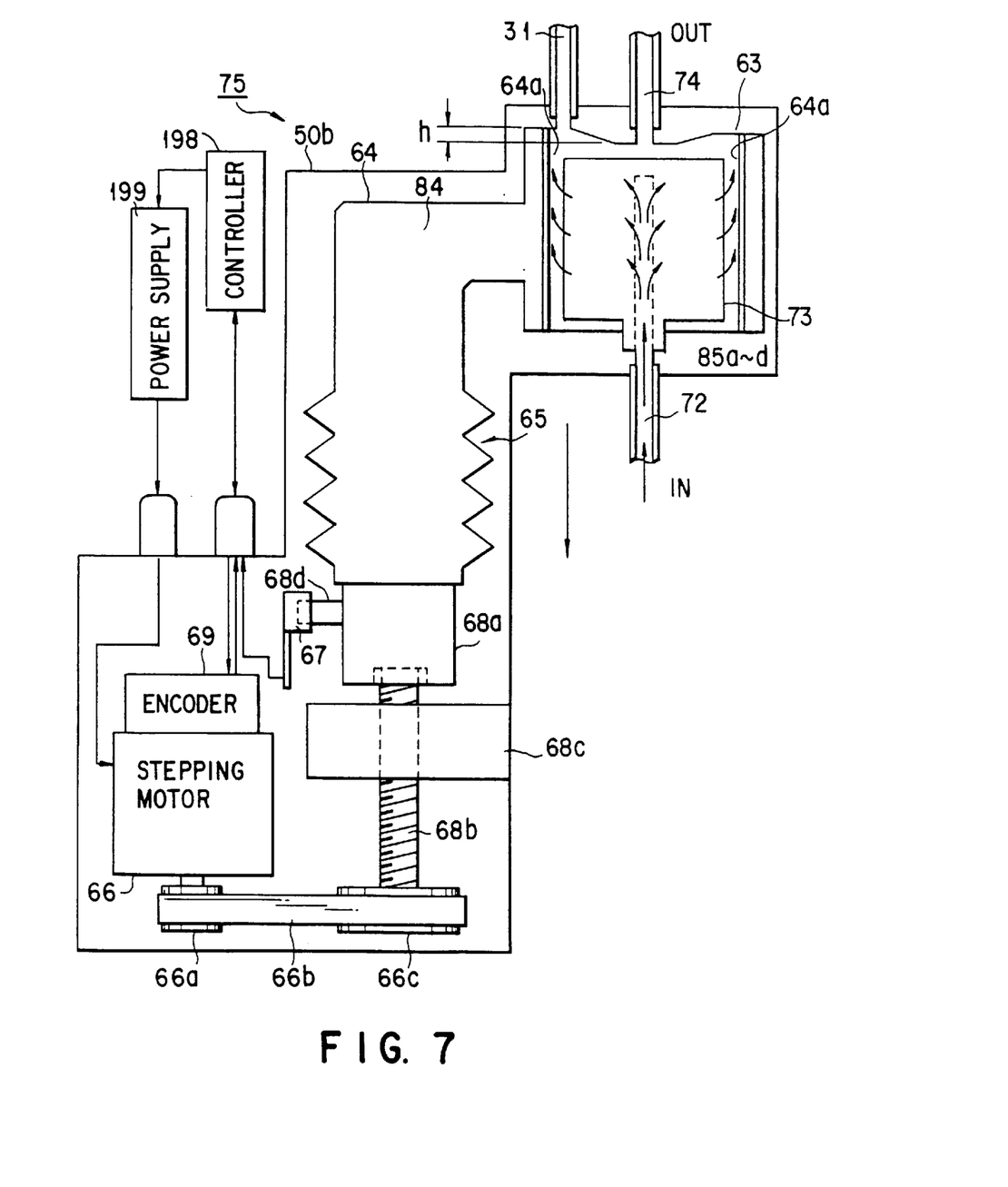
FIG. 7 is a perspective cross-sectional view schematically showing the pump with a built-in filter while sucking a liquid.
Figure 8:
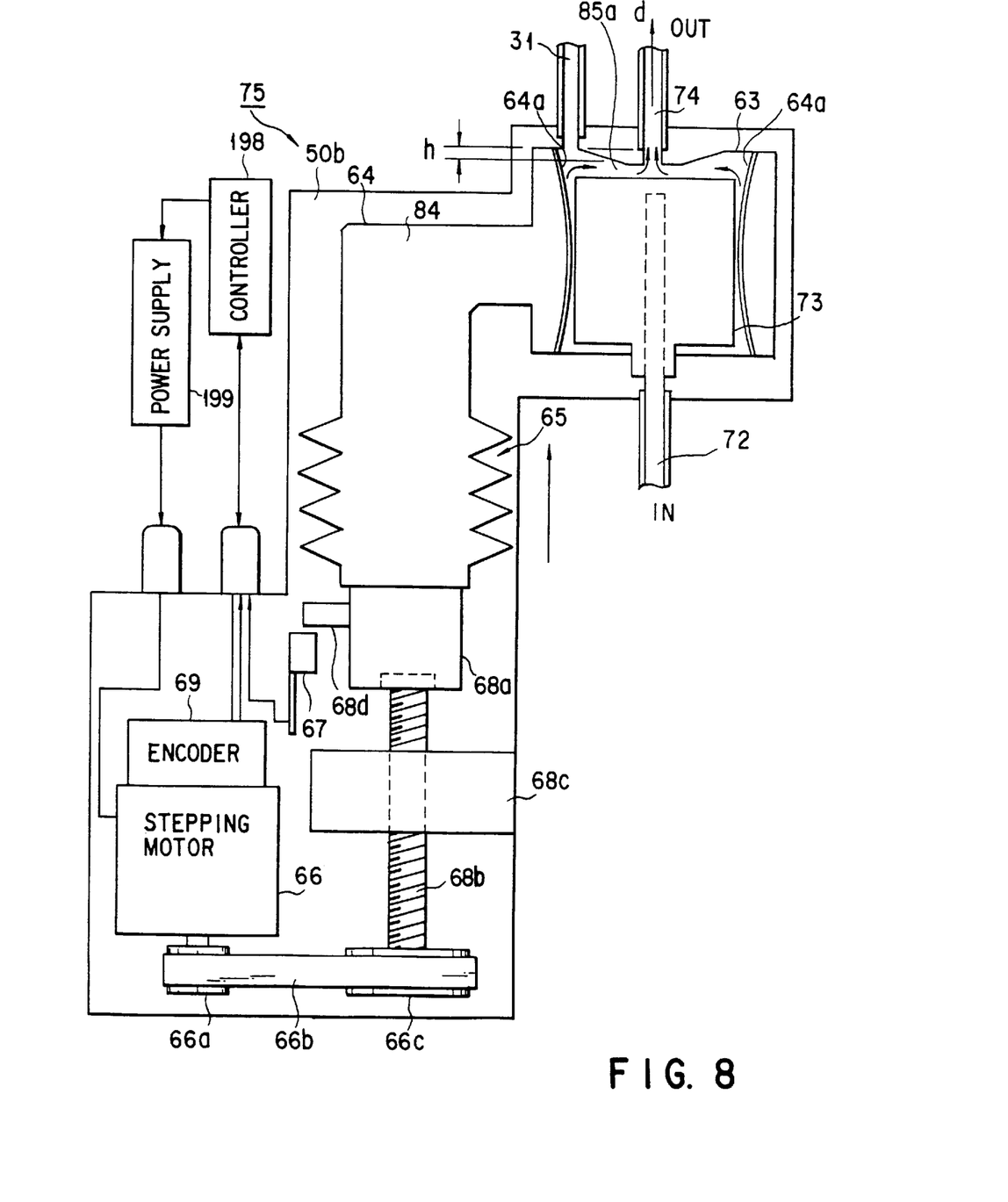
FIG. 8 is a perspective cross-sectional view schematically showing the pump with a built-in filter while spurting a liquid.

The pump 75 is a tubephragm pump in which sucking and spurting are repeated alternately by swinging an inner pressure of the pump chamber 63. The almost cylindrical pump chamber 63 has an elastic diaphragm 64a formed of PFA (tetrafluoroethylene-perfluoroalkylvinylether copolymer) therein. A pressure transmitting medium 84 is charged in the entire bellows portion 65 and a part of the pump chamber 63. The pressure transmitting medium 84 plays a role in transmitting driving force, which is generated by the expansion-contraction movement of the bellows portion 65, to the diaphragm 64a of the pump chamber 63.

The bellows portion 65 is expanded or contracted accurately by a stepping motor 66. The expansion and contraction movement, in other words, timing and sucking and spurting speeds of the resist solution are controlled by the controller 198 in accordance with predetermined conditions. The stepping motor 66 is equipped with an encoder 69.

A light transmissible sensor 67 is provided near the movable supporting portion 68. A shutter member 68d is provided on the movable supporting portion 68 so as to cross the optical axis of the sensor 67. Movement of the bellows portion 65 is detected by the sensor 67. To explain more specifically, as shown in FIG. 7, since the shutter member 68d blocks the optical axis 67 of the sensor 67 when the bellows expands to the uppermost limit (corresponding to the terminal point of liquid suction), a light receiving portion of the sensor 67 cannot detect a laser light. On the other hand, as shown in FIG. 8, since the shutter member 68d does not block the optical axis of the sensor 67 when the bellows portion 65 contracts to the lowermost limit (corresponding to the terminal point of the liquid spurting), the light receiving portion of the sensor 67 can detect a laser light. When the detected signal is input into the controller 198, the controller 198 sends a command to an electric source 199 of the motor 66 to drive belt mechanisms 66a to 66c and ball screw mechanisms 68a to 68c, respectively. In this way, the bellows portion 65 is allowed to expand.

The rotation number of the driving shaft of the motor 66 is counted by the encoder 69. When the count number is input into the controller 198, the operation of the motor 66 is controlled by the controller 198 in a feed-back manner.

Next, the pump chamber 63 will be explained in detail.

The pump chamber 63 is defined by a side peripheral wall 63a, a bottom wall 63b, and a ceiling wall 63d. The pump chamber 63 is divided by a diaphragm 64a to separate an inner region from the outer region. A coating solution 85d is supplied into the inner region through the filter 73. The pressure transmitting medium 84 mentioned above is enclosed in the outer region.

A depressed portion 63c is formed at the center of the bottom wall 63b. The sucking-solution passageway 72 is connected to the depressed portion 63c through a backward-flow preventing valve 77A. The backward-flow preventing valve 77A consists of a ball 78, an inlet 79, a ball housing chamber 80, a stopper 81, a ball receiving portion 82, and an outlet 83. The ball 78 fits in the ball receiving portion 82 of the stopper 81 during the sucking step. The coating solution 85d is therefore introduced from the inlet 79, passed through the outlet 82, and flow into the filter 73. In contrast, the ball 78 blocks the inlet 79 in the spurting step. The coating solution 85d therefore does not flow into the filter 73 of the pump chamber 63.

Figure 9:
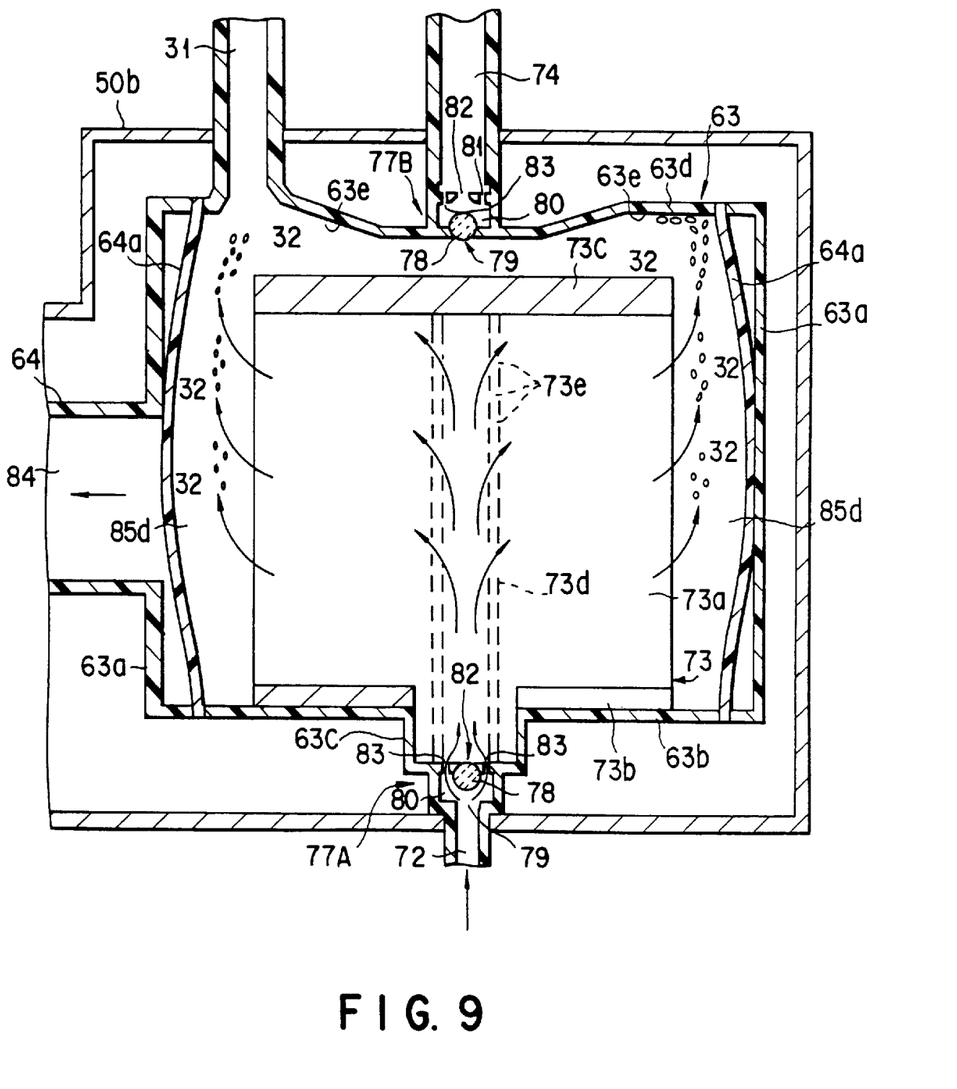
FIG. 9 is an enlarged cross-sectional view showing a filter portion while sucking a liquid.
Figure 10:
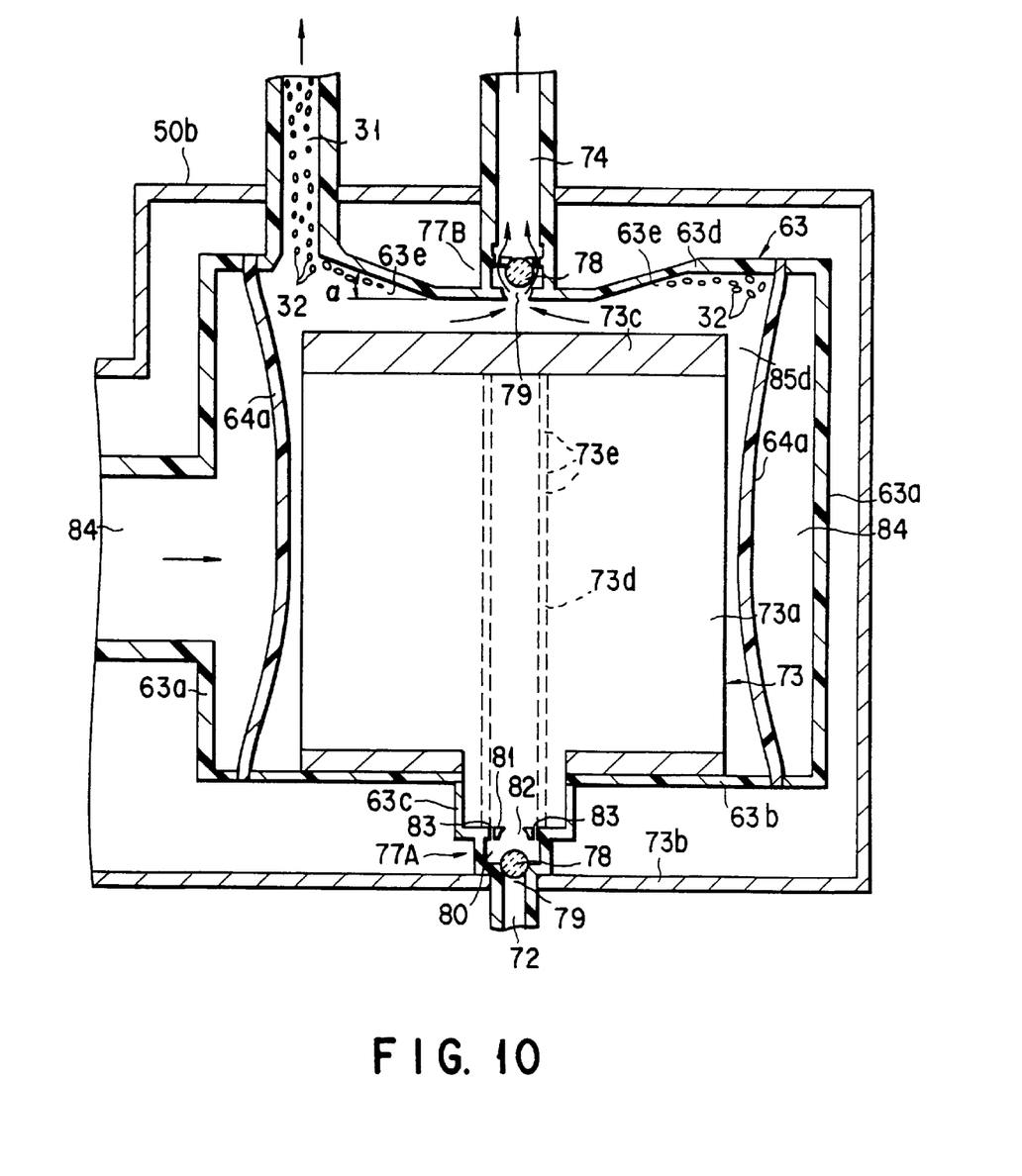
FIG. 10 is an enlarged cross-sectional view showing a filter portion while spurting a liquid.

The filter 73 has an element 73a, upper and lower press boards 73b and 73c, and a porous pipes 73d. The porous pipe 73d is buried in the central portion of the element 73a and connected to the suction passageway 72. The porous pipe 73d has numerous pores 73e in the walls extending from the depressed portion 63c to the upper end of the element 73a. The coating solution 85d is radially dispersed through numerous pores 73e to the element 73a. It should be noted that the diameter of the pump chamber 63 is 60 to 70 mm, the height thereof is about 60 to 70 mm. The filter element 73a is a porous or fibrous cylindrical body formed of polytetrafluoroethylene (PTFE) and polyethylene. It is desirable that an average diameter of fine pores of the filter element 73a be, for example, 0.05 μm or less.

The tubephragm 64 is communicated with the pump chamber 63 by the openings provided in the side peripheral wall 63a. The pump driving force is transmitted from the bellows portion 65 to the diaphragm 64a via the flowing medium 84. The diaphragm 64a is concentrically arranged to the filter 73 with keeping almost the same distance between the diaphragm and the filter 73. The diaphragm 64a is made of an elastic resin material such as tetrafluoroethylene-perfluoroalkylvinylether copolymer (PFA).

A spurting solution passageway 74 is connected to the center of the ceiling wall 63d via the backwardflow preventing valve 77B. On the other hand, a vent passageway 31 is formed in the peripheral portion of the ceiling wall 63d. The peripheral portion of the ceiling 63d is formed higher than the center portion thereof. A bubble assembling portion 63e is formed at the higher peripheral portion. Bubbles assemble at the bubble assembling portion 63e when the coating solution 85d is sucked. The assembled bubbles are discharged from the pump chamber 63 by way of the bubble assembling portion 63e by way of the vent passageway 31. It is desirable that the bubble assembling portion 63e be inclined to the horizontal plane by an oblique angle within 5 to 10°. The backward-flow preventing valve 77B set on the spurting solution passageway is substantially the same as the backward-flow preventing valve 77A on the sucking solution passageway side.

When the bellows portion 65 is expanded as shown in FIG. 7, the coating solution 85d is introduced into the pump chamber 63 through the filter 73, as shown in FIG. 9. Whereas, when the bellows portion 65 is contracted as shown in FIG. 8, the coating solution 85d is discharged from the pump chamber 63 as shown in FIG. 10. Since the sucking solution passageway 72 and the spurting passageway 74 are communicated with the atmosphere, when the pressure is transmitted from the bellows portion 65 to the pump chamber 63 through the diaphragm 64, the inner pressure of the pump chamber 63 is reduced or increased. In this mechanism, the coating solution 85d is introduced into or discharged from the pump chamber 63.

As the pressure transmitting medium 84 enclosed in the tubephragm 64, it is desirable to use a liquid such as a Teflon oil, other oils, and pure water. When the liquid is employed as the pressure transmitting medium 84, the change in volume of the tubephragm 64 with the passage of time can be controlled, with the result that the peripheral walls 63a to 63d of the pump chamber 63 can be swung stably for a long time.

Furthermore, the opening for the vent passageway 31 formed in the ceiling wall 63d is positioned higher by a height "h" than the opening for the spurting solution passageway 74. Therefore, the bubbles 32 assemble at a place 63e higher than the opening of the spurting solution passageway 74. In this mechanism, the bubbles are discharged outside from the portion 63e by way of the vent 31. As a result, the bubbles 32 are successfully prevented from entering into the spurting solution passageway 74. The vent 31 is communicated with the atmosphere via a valve (not shown). The bubbles 32 stored at the upper portion of the pump chamber 63 are discharged by opening the valve periodically, for example, at the time the resist tank 71 is exchanged.

Figure 11:
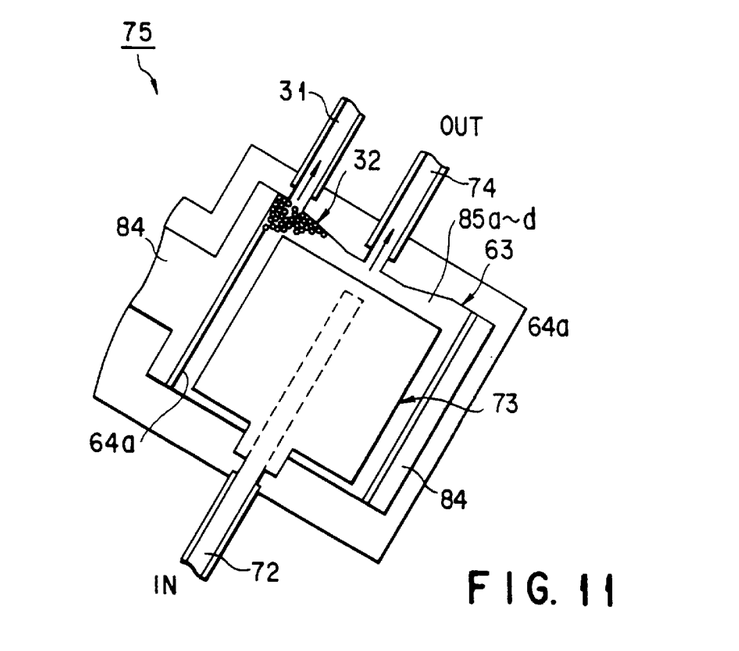
FIG. 11 is a perspective cross-sectional view of filter portion of a coating apparatus according to another embodiment of the present invention.

As shown in FIG. 11, the ceiling of the pump chamber 63 may be inclined to the horizontal plane by an angle of 1 to 20° to allow the opening of the vent 31 to position at the highest position. If so, the bubbles 32 are discharged from the pump chamber 63 via the vent 31 more swiftly.

Figure 12:
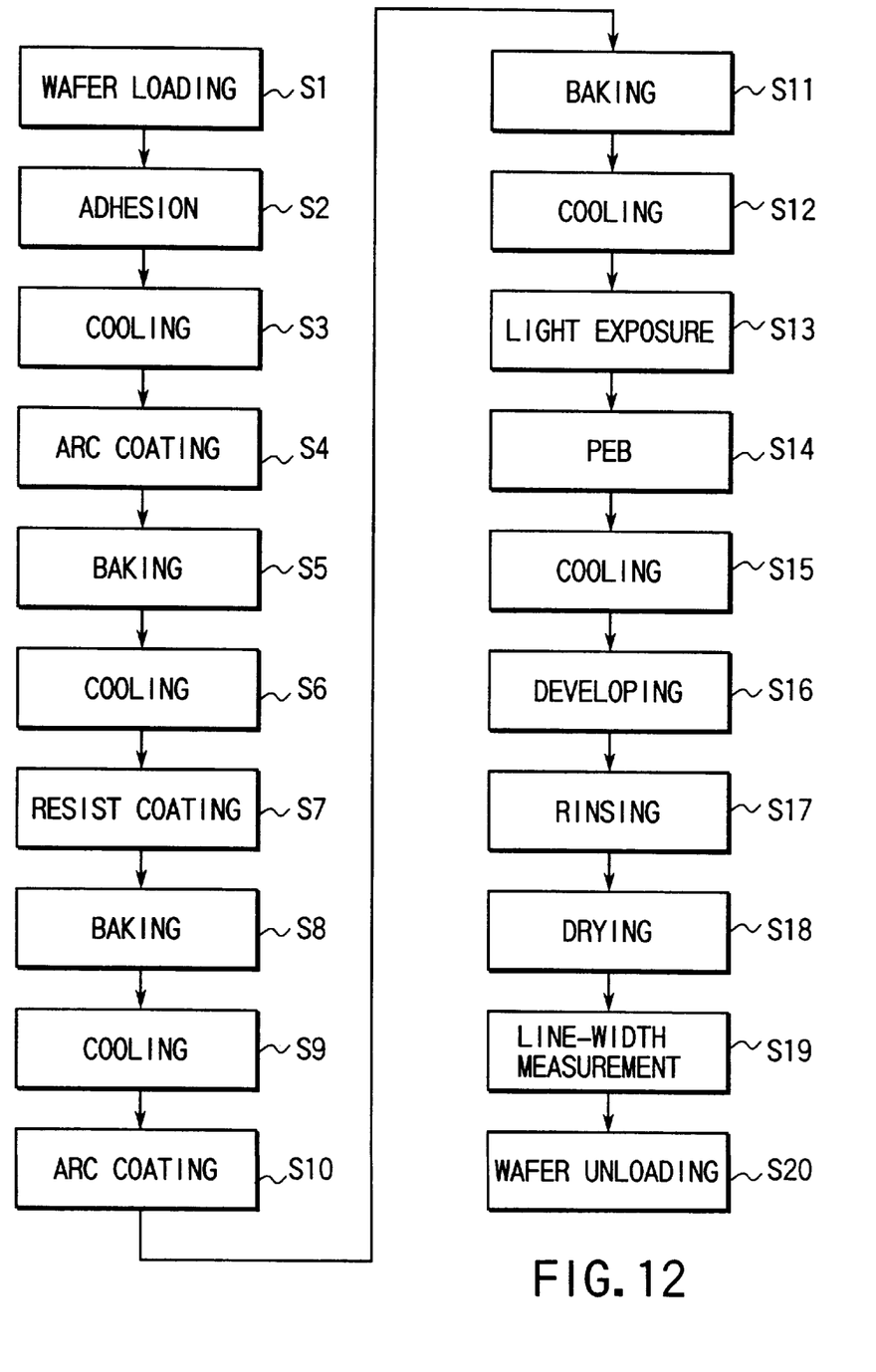
FIG. 12 is a flow chart showing a coating method according to an embodiment of the present invention.

Next, the method of processing a wafer W by use of the system 1 with reference to FIG. 12.

The wafer W is taken out from the cassette CR by the first sub arm mechanism 21 and transferred to the extension unit (EXT) of the process station 11 (Step S1). The wafer W is then taken out from the extension unit (EXT) by the main arm mechanism 22 and loaded into the adhesion unit (AD) to subjected to the adhesion treatment (Step S2). Thereafter, the wafer W is taken out from the adhesion unit (AD) by the main arm mechanism 22, and loaded into the cooling unit (COL) to cool it (Step S3).

The wafer W is taken out from the cooling unit (COL) by the main arm mechanism 22 to load it into the coating unit (COT). The wafer W is spin-coated with ARC solution 85d in the coating unit (COT) to form a first anti-reflection film (Step 4). Since the ARC solution 85d contains a predetermined amount of a surfactant, the bubbles 32 tend to be generated in the supply route. However, since the bubbles 32 stored in the pump chamber 63 are discharged from the pump chamber 63 via the vent 31, the ARC solution spurted from the nozzle 86D contains no bubbles 32. Since the ARC solution 85d contains no bubbles 32, the resultant ARC film is defect-free. It should be noted that the first ARC film has a thickness of several tens nm.

The wafer W is then taken out from the coating unit (COT) by the main arm mechanism 22 and loaded into the baking unit (PREBAKE). The first ARC film is baked at a predetermined temperature in the baking unit (PREBAKE) (Step S5). Subsequently, the wafer is taken out form the baking unit (PREBAKE) and loaded into the cooling unit (COL) to cool it (Step S6).

The wafer W is taken out form the cooling unit (COL) by the main arm mechanism 22 and loaded into the coating unit (COT). The wafer W is spin-coated with the resist solution 85a to form a resist film (Step S7).

In the step S7, the resist solution 85a is sucked into the pump chamber 75A slowly (at a low sucking speed) and spurted from the pump chamber 75A in one breath (at a high spurting speed). The resist solution 85a is therefore not contaminated with particles and gelatinized resist, the resist film formed of the non-contaminated resist solution 85a is defect-free. It should be noted that the film thickness of the resist film is in the order of several tens nm.

The wafer W is taken out from the coating unit (COT) by the main arm mechanism 22 and loaded into the baking unit (PREBAKE). The resist film is baked at a predetermined temperature in the baking unit (PREBAKE) (Step S8). Subsequently, the wafer W is taken out from the baking unit (PREBAKE) by the main arm mechanism 22 and loaded into the cooling unit (COL to cool it (Step S9).

The wafer W is taken out from the cooling unit (COL) by the main arm mechanism 22 and loaded into the coating unit (COT). The wafer W is spin-coated with the ARC solution 85d in the coating unit (COT) to form a second anti-reflection film. (Step S10). Since the ARC solution 85d contains a predetermined amount of a surfactant, bubbles 32 tend to be generated in the supply route. However, since the bubbles 32 stored in the pump chamber 63 are discharged from the pump chamber 63 by way of the vent 31, the solution spurted from the nozzle 86D contains no bubbles 32. As a result, the ARC film formed of the bubble-free ARC solution is defect-free. It should be noted that the film thickness of the ARC film is in the order of several tens nm.

The wafer W is taken out from the coating unit (COT) by the main arm mechanism 22 and loaded into the baking unit (PREBAKE). The second anti-reflection film is baked at a predetermined temperature in the baking unit (PREBAKE) (Step S11). Then, the wafer W is taken out from the baking unit (PREBAKE) by the main arm mechanism 22 and loaded into the cooling unit (COL) to cool it (Step S12).

The wafer W is then taken out form the cooling unit (COL) by the main arm mechanism 22 and loaded into the extension unit (EXT). The wafer is taken out from the Extension unit (EXT) by the second arm mechanism 24 and loaded in the interface unit 12. The wafer is then passed to a transfer mechanism (not shown) of the light exposure apparatus by the second sub arm mechanism 24. The wafer W is treated in the light-exposure apparatus to form a latent-image pattern on the resist film (Step S13).

After the light exposure, the wafer W is passed to the main arm mechanism through the interface unit 12 and the extension unit (EXT). The wafer is then transferred to the baking unit (POBAKE) by the main arm mechanism 22. The resist film of the water is subjected to the post-light exposure baking (PEB) in the baking unit (POBAKE) (Step S14). Thereafter, the wafer is taken out form he baking unit (POBAKE) by the main arm mechanism 22 and loaded into the cooling unit (COL) to cool it (Step S15).

The wafer W is taken out from the cooling unit (COL) by the main arm mechanism 22 and loaded into the developing unit (DEV). A developing liquid is poured to the resist film with a latent-image pattern formed thereon, in the developing unit (DEV), thereby developing the image (Step 16). Subsequently, the wafer W is rinsed with pure water to wash out the developing solution (Step S17) and further subjected to a drying step (Step S18). Any one of the processed wafers is taken out as a sample to measure the line width of the pattern circuit (Step S19). The processed wafer W is returned into the cassette CR of the cassette station 10. The cassette CR containing processed wafers W is unloaded from the system 1 (Step S20).

Next, operation timings of the pumps 75, 75A and the valve 76 of the coating apparatus will be respectively explained with reference to FIGS. 13A to 13C.

As shown in FIG. 13A, the bellows portion 65 is expanded slowly by time-point T1 to allow the coating solution to introduce into the pump chamber 63 little by little. The suction is slowly terminated during the time period from T1 to T2.

Figure 13B:
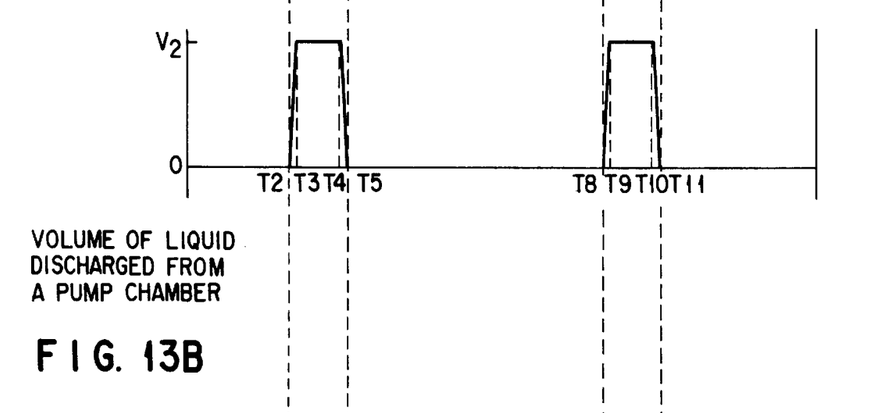
Figure 13C:
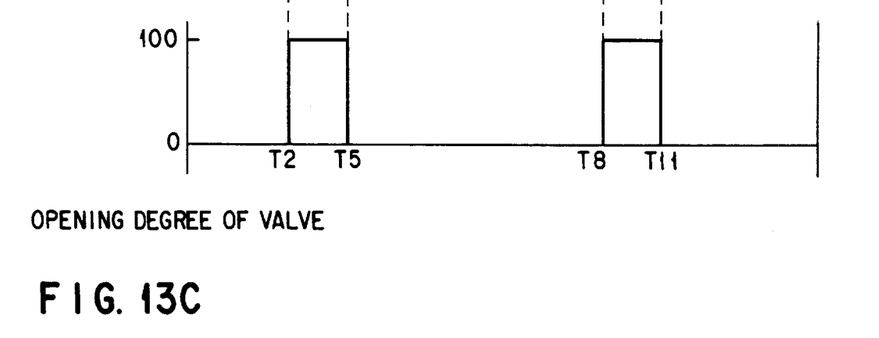

As shown in FIG. 13B, immediately upon time T2, the bellows portion 65 is closed to allow the coating solution to spurt out from the pump chamber 63. At the same time, the valve 76 is completely opened to allow the coating solution to spurt out from the nozzles 86A and 86D briefly in one breath (from time-point T2 to time-point T5), as shown in FIG. 13C.

Immediately after the valve 76 is closed to terminate the spurting step, a sucking step is slowly initiated between time-point T5 and time-point T6, as shown in FIG. 13A. From time-point T6 to time-point T7, the bellow portion 65 is slowly expanded to allow the coating solution to introduce into the pump chamber 63. The sucking step is slowly terminated between time-point T7 to T8. The time from T5 to T6 required for switching to the sucking step is longer than that from T2 to T3.

At the time-point T8, the bellows portion 65 is immediately closed to allow the coating solution to spurt out from the pump chamber, as shown in FIG. 13B. At the same time, the valve 76 is completely opened to allow the coating solution to spurt out from the nozzles 86A and 86D briefly in one breath (from T8 to T11), as shown in FIG. 13C. Immediately after the valve 76 is closed to complete the spurting step, the sucking step is restarted slowly between time-point T11 to time-point T12. It take about 45 seconds to finish one cycle operation from T5 to T11.

The spurting speed of the resist solution 85a is defined at a value necessary for obtaining a predetermined film thickness; whereas, the sucking speed can be freely set during the period from T5 (time at which the spurting of the resist solution 85a is completed) to T8 (time at which the next sucking is initiated). For example, if the amount of the resist solution 85a per second is set at about 2 cc, the spurting time is one second, one minute is required from the period of time from T5 to T8 until the next spurting step is started, 2 cc of the resist solution 85a may be introduced into the pump chamber 63 for one minute. The sucking speed may be significantly slow compared to the spurting speed.

The spurting speed of the ARC solution 85d is defined by a value necessary for obtaining a predetermined film thickness, whereas the sucking speed can be freely set during the period from T5 (time at which the spurting of the ARC solution 85d is completed) to T8 (time at which the next sucking is restarted). For example, if the amount of the ARC solution 85d per second is set at about 5 cc, the spurting time is 1.5 seconds, one minute is required for the period of time from T5 to T8 until the next spurting step is started, about 5 cc of the ARC solution 85d may be sucked into the pump chamber 63 for one minute. The sucking speed may be significantly slow compared to the spurting speed.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A coating apparatus comprising:

a coating solution supply source for supplying a coating solution;

a mounting table for holding a substrate to allow a surface to be coated to face upward;

a nozzle for pouring the coating solution toward the surface of the substrate to be coated, mounted on the mounting table;

a pump chamber having a sucking port for introducing the coating solution from the coating solution supply source and a spurting port for spurting the coating solution to be supplied toward the nozzle;

a pump driving mechanism for increasing or decreasing an inner pressure of the pump chamber to introduce and spurt the coating solution into/from the pump chamber;

a filter provided inside or at the upstream side of the pump chamber for filtrating the coating solution so as to remove a gel and particles from the coating solution before the coating solution is spurted out from the pump chamber through the spurting port;

a valve provided between the pump chamber and the nozzle for regulating a flow amount of the coating solution to be sent from the pump chamber to the nozzle; and a controller for controlling the operation of the pump driving mechanism in such a manner that a sucking speed of the coating solution into the pump chamber is smaller than a spurting speed of the coating solution from the pump chamber, said sucking speed allowing the coating solution to pass through the filter but not allowing the gel and particles to pass through the filter.

2. The apparatus according to claim 1, wherein said filter is provided inside the pump chamber; an opening of said sucking port is formed in the filter; and an opening of said spurting port is formed above the filter;

and further comprising a flexible diaphragm for dividing the pump chamber into two regions, one having the filter and the other having no filter; and a tubephragm having an expandable and contractible bellows portion, said tubephragm containing pressure transmitting medium for transmitting pressure to the flexible diaphragm.

3. The apparatus according to claim 1, wherein said filter further comprises a filter element for capturing foreign materials in the coating solution, and a dispersing tube having a plurality of pores whose openings are formed in the filter element.

4. The apparatus according to claim 1, further comprising a vent formed at the upper portion of the pump chamber, for discharging bubbles from the pump chamber.

5. The apparatus according to claim 4, wherein an opening of said vent is formed at a position higher than the position of the spurting port of the pump chamber.

6. The apparatus according to claim 5, wherein an opening of said vent is provided at the highest position of the pump chamber.

7. The apparatus according to claim 1, wherein said pump driving mechanism comprises a bellows portion communicating with the pump chamber;

a ball screw mechanism for contracting and expanding the bellows portion; and a belt mechanism for rotating a screw shaft of the ball screw mechanism.

8. The apparatus according to claim 1, wherein said sucking port and said spurting port are communicated with the atmosphere.

9. The apparatus according to claim 4, wherein said sucking port, said spurting port and said vent are communicated with the atmosphere.

10. The apparatus according to claim 1, wherein said mounting table for holding a substrate is a spin chuck which spin-rotates the substrate.

11. The apparatus according to claim 1, wherein said coating solution is a resist solution containing a solvent.

12. The apparatus according to claim 1, wherein said coating solution is an anti-reflection film coating solution containing a surfactant.

13. The apparatus according to claim 1, further comprising a pressure difference detection apparatus for detecting a difference between the liquid pressure at an upstream side and the liquid pressure at a downstream side of the filter, wherein the controller controls the pump driving mechanism on the basis of a detection signal from the pressure difference detection apparatus.

14. The apparatus according to claim 1, wherein the filter has a porous or fibrous filter element having fine pores of 0.05 $\mu$m or less in average diameter.

15. The apparatus according to claim 1, wherein a gel easily generates in the coating solution until the coating solution moves from the coating solution supply source to the pump chamber.

16. A coating method comprising the steps of:

(a) preparing a mounting table, a coating solution supply source, a filter, a pump chamber, a pump driving mechanism, a nozzle and an operation valve;

(b) mounting a substrate on the mounting table;

(c) filtrating a coating solution and removing a gel and particles from the coating solution by sending the coating solution to the filter from the coating solution supply source;

(d) sucking the filtrated coating solution into the pump chamber by the pump driving mechanism at a first flow rate, said first flow rate allowing the coating solution to pass through the filter but not allowing the gel and particles to pass through the filter;

(e) discharging the coating solution from the pump chamber by the pump driving mechanism at a second flow rate which is faster than the first flow rate; at the same time opening the operation valve; and (f) forming a coating film by discharging the coating solution from the nozzle toward the substrate mounted on the mounting table.

17. The method according to claim 16, wherein, in said steps (c) and (d), the coating solution is filtrated by the filter built in the pump chamber while sucking.

18. The method according to claim 16, wherein, time required for said step (d) is longer than that for said step (e).

19. The method according to claim 16, wherein, in said step (e), bubbles are discharged from the pump chamber so as not to contain the bubbles in the coating solution to be spurted.

20. The method according to claim 16, wherein, in said step (f), the substrate is spin-rotated.

21. The method according to claim 16, wherein, said coating solution is a resist solution containing a solvent.

22. The method according to claim 16, wherein said coating solution is an anti-reflection film coating solution containing a surfactant.

23. The apparatus according to claim 16, wherein the filter has a porous or fibrous filter element having fine pores of 0.05 $\mu$m or less in average diameter.

24. The apparatus according to claim 16, wherein a gel easily generates in the coating solution until the coating solution moves from the coating solution supply source to the pump chamber.

* * * * *